United States Patent
Yu et al.

(10) Patent No.: US 9,692,396 B2
(45) Date of Patent: Jun. 27, 2017

(54) RING OSCILLATOR ARCHITECTURE WITH CONTROLLED SENSITIVITY TO SUPPLY VOLTAGE

(71) Applicant: QUALCOMM Incorporated, San Diego, CA (US)

(72) Inventors: Xinxin Yu, Santa Clara, CA (US); Ashok Swaminathan, Cardiff, CA (US); Christian Venerus, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/711,158

(22) Filed: May 13, 2015

(65) Prior Publication Data
US 2016/0336924 A1  Nov. 17, 2016

(51) Int. Cl.
*H03K 3/03* (2006.01)
*H03K 3/011* (2006.01)
*H03L 7/099* (2006.01)

(52) U.S. Cl.
CPC .......... *H03K 3/0315* (2013.01); *H03K 3/011* (2013.01); *H03L 7/0995* (2013.01); *H03L 7/0997* (2013.01)

(58) Field of Classification Search
CPC .... H03K 3/0315; H03K 3/011; H03L 7/0995; H03L 7/0997
USPC .......... 331/57, 185; 327/250, 393, 395, 400
See application file for complete search history.

(56) References Cited

U.S. PATENT DOCUMENTS

| 4,849,717 A | * | 7/1989 | Fitzpatrick | ............. | H03K 3/011 331/108 D |
| 5,544,120 A | | 8/1996 | Kuwagata et al. | | |
| 5,973,524 A | * | 10/1999 | Martin | ................ | H03K 3/0231 307/39 |

(Continued)

FOREIGN PATENT DOCUMENTS

| CA | 2260626 A1 | 7/2000 |
| EP | 0254212 A2 | 1/1988 |

(Continued)

OTHER PUBLICATIONS

Ren J., et al., "Design of Low-Voltage Wide Tuning Range CMOS Multipass Voltage-Controlled Ring Oscillator," 53rd IEEE International Midwest Symposium on Circuits and Systems (MWSCAS), 2010, pp. 109-112.

(Continued)

*Primary Examiner* — Richard Tan
(74) *Attorney, Agent, or Firm* — Arent Fox, LLP

(57) ABSTRACT

A method and apparatus for controlling a supply sensitivity of a ring oscillator stage are provided. The apparatus is configured to generate, via a voltage biasing module, a first bias signal for a PMOS biasing module based on a supply voltage and a second bias signal for a NMOS biasing module based on the supply voltage, bias, via the PMOS biasing module, triode PMOS degeneration of the inverting module based on the first bias signal, bias, via the NMOS biasing module, triode NMOS degeneration of the inverting module based on the second bias signal, receive an input via an inverting module, and output, via the inverting module, an inverted version of the received input based on the biased triode NMOS degeneration and the biased triode PMOS degeneration.

26 Claims, 8 Drawing Sheets

(56) References Cited

U.S. PATENT DOCUMENTS

| | | | |
|---|---|---|---|
| 6,759,875 B2 | 7/2004 | Mano et al. | |
| 6,803,831 B2 * | 10/2004 | Nishikido | H03K 3/0315 |
| | | | 331/17 |
| 7,589,583 B2 * | 9/2009 | Yoshikawa | G11C 5/145 |
| | | | 327/536 |
| 7,663,447 B2 * | 2/2010 | Matsuzaki | H01L 27/1214 |
| | | | 331/185 |
| 7,948,330 B2 | 5/2011 | Seo et al. | |
| 7,973,612 B2 | 7/2011 | Raghunathan et al. | |
| 8,294,525 B2 * | 10/2012 | Bulzacchelli | H03L 7/0995 |
| | | | 331/1 A |
| 2005/0206466 A1 * | 9/2005 | Sohn | G11C 7/222 |
| | | | 331/185 |
| 2006/0226921 A1 | 10/2006 | Hsu | |
| 2010/0315114 A1 | 12/2010 | Pelgrom et al. | |

FOREIGN PATENT DOCUMENTS

| | | |
|---|---|---|
| KR | 101276730 B1 | 6/2013 |
| WO | 2006093614 A1 | 9/2006 |

OTHER PUBLICATIONS

International Search Report and Written Opinion—PCT/US2016/027925—ISA/EPO—Jul. 11, 2016.

\* cited by examiner

RING OSCILLATOR ARCHITECTURE WITH CONTROLLED SENSITIVITY TO SUPPLY VOLTAGE

BACKGROUND

Field

The present disclosure relates generally to communication systems, and more particularly, some examples relate to an apparatus and method for controlling voltage supply sensitivity of a ring oscillator.

Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, downconvert the received RF signal with a receive LO signal, and process the downconverted signal to recover data sent by the base station.

The wireless device may include one or more oscillators to generate one or more oscillator signals at one or more desired frequencies. The oscillator signal(s) may be used to generate the transmit LO signal for the transmitter and the receive LO signal for the receiver. The oscillator(s) may be required to generate the oscillator signal(s) to meet the requirements of the wireless communication system with which the wireless device communicates.

A ring oscillator used in a phased locked loop (PLL) may have poor power supply rejection. Accordingly, use of the ring oscillator in the PLL may be improved by regulating a power supply.

Moreover, the ring oscillator may be used in a voltage-controlled oscillator (VCO)-based quantizer for supply sensing. The ring oscillator can translate a supply voltage into frequency and then digitized. Accordingly, it may be desirable to implement a VCO that is very highly sensitive to the supply voltage in order to achieve high digital resolution.

SUMMARY

In an aspect of the disclosure, a method and apparatus for controlling a supply sensitivity of a ring oscillator stage are provided. The apparatus is configured to generate, via a voltage biasing module, a first bias signal for a PMOS biasing module based on a supply voltage and a second bias signal for a NMOS biasing module based on the supply voltage, bias, via the PMOS biasing module, triode PMOS degeneration of the inverting module based on the first bias signal, bias, via the NMOS biasing module, triode NMOS degeneration of the inverting module based on the second bias signal, receive an input via an inverting module, and output, via the inverting module, an inverted version of the received input based on the biased triode NMOS degeneration and the biased triode PMOS degeneration.

In another aspect, the method for controlling a supply sensitivity of a ring oscillator stage includes generating, via a voltage biasing module, a first bias signal for a PMOS biasing module based on a supply voltage and a second bias signal for a NMOS biasing module based on the supply voltage, biasing, via the PMOS biasing module, triode PMOS degeneration of the inverting module based on the first bias signal, biasing, via the NMOS biasing module, triode NMOS degeneration of the inverting module based on the second bias signal, receiving an input via an inverting module, and outputting, via the inverting module, an inverted version of the received input based on the biased triode NMOS degeneration and the biased triode PMOS degeneration.

In a further aspect, the apparatus for controlling a supply sensitivity of a ring oscillator stage includes inverting means for receiving an input and outputting an inverted version of the received input, PMOS biasing means for biasing triode PMOS degeneration of the inverting means, NMOS biasing means for biasing triode NMOS degeneration of the inverting means, and voltage biasing means for generating a first bias signal for the PMOS biasing means based on a supply voltage and a second bias signal for the NMOS biasing means based on the supply voltage. The PMOS biasing means is configured to bias the triode PMOS degeneration of the inverting means based on the first bias signal. The NMOS biasing means is configured to bias the triode NMOS degeneration of the inverting means based on the second bias signal. The inverted version of the received input is outputted via the inverting means based on the biased triode NMOS degeneration and the biased triode PMOS degeneration.

DETAILED DESCRIPTION

Figure 1:
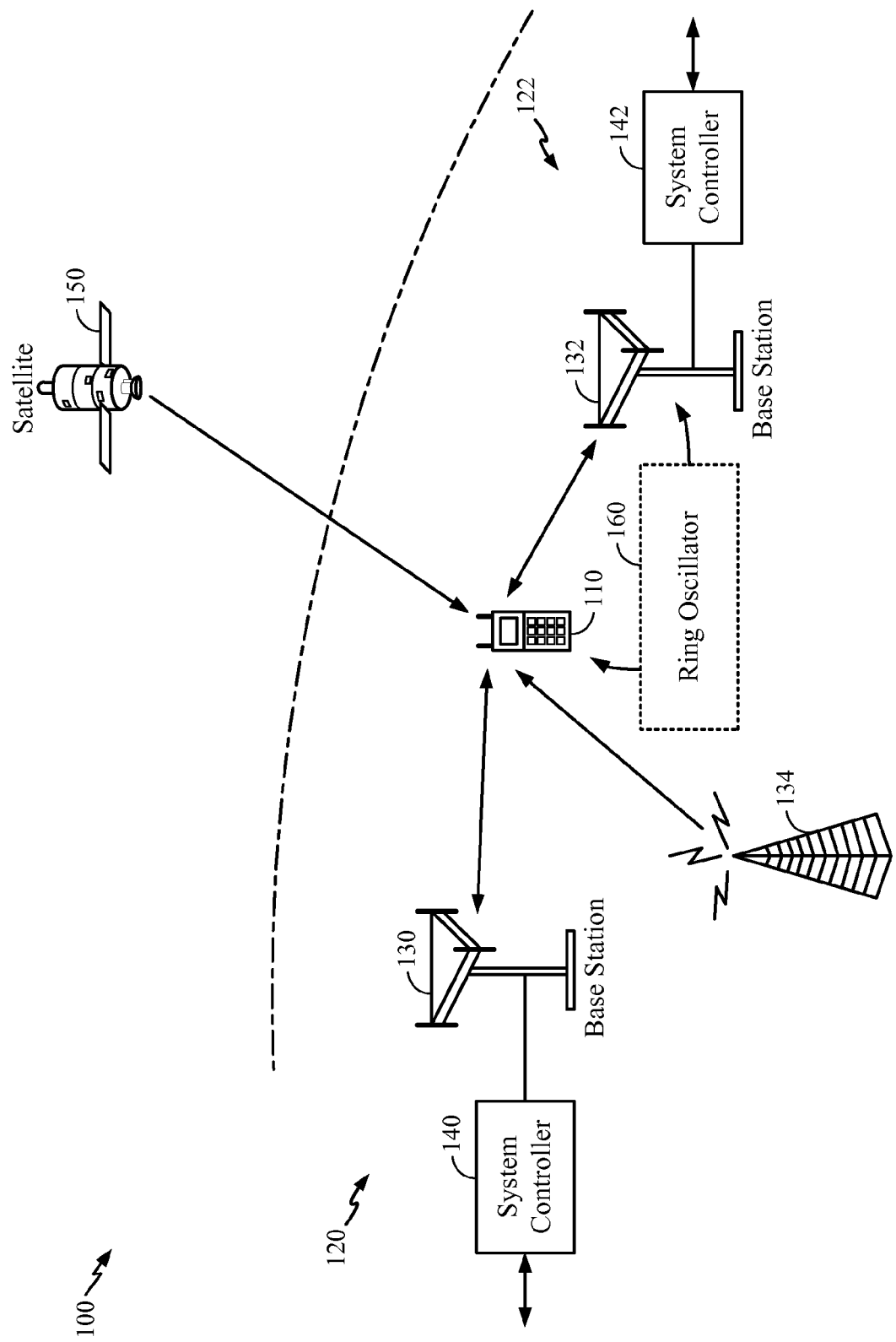
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods.

For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE. The wireless device 110 and/or the base stations 130, 132 may include an exemplary ring oscillator 160. An exemplary ring oscillator 160 is provided infra.

Figure 2:
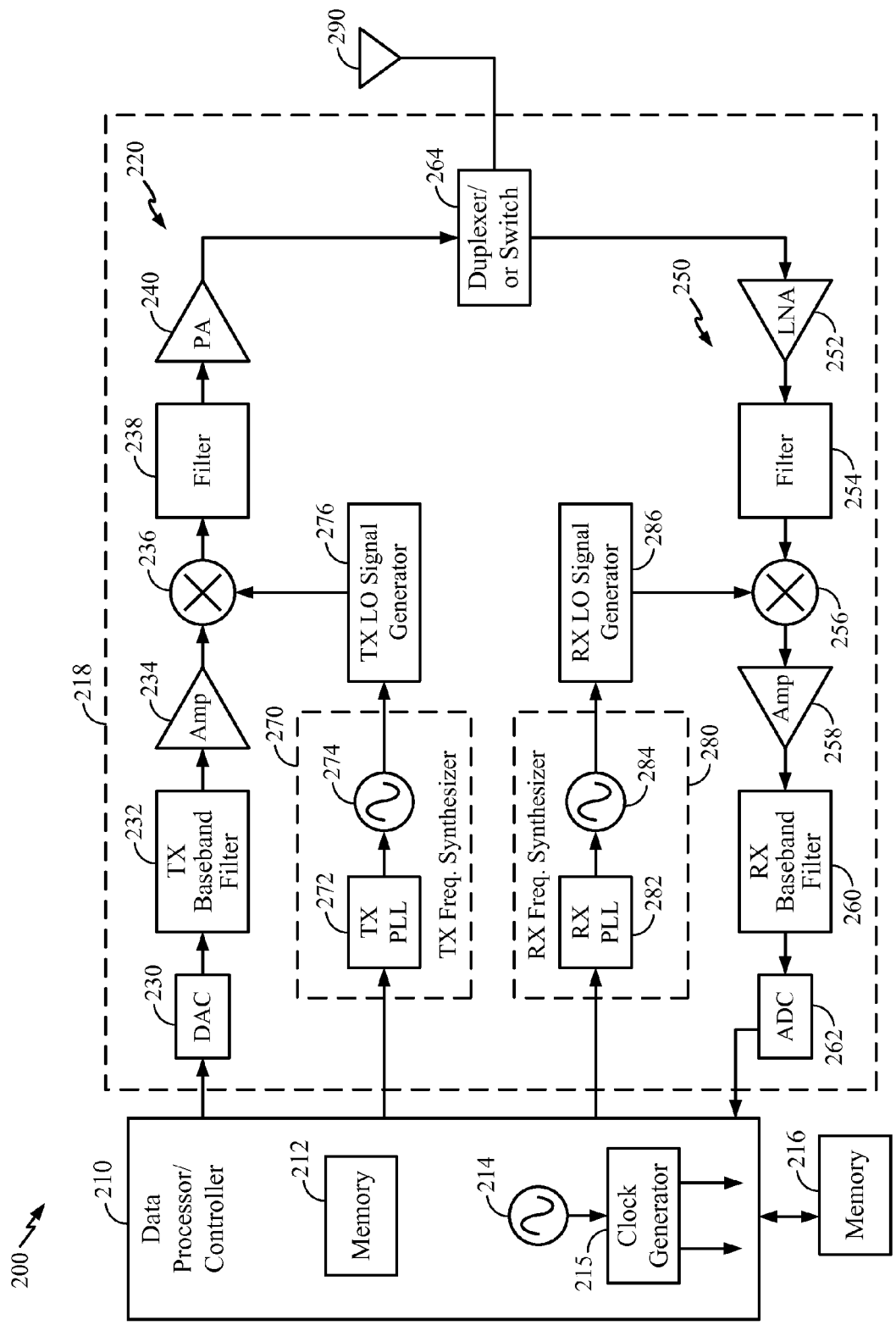
FIG. 2 is a block diagram of a wireless device.

FIG. 2 is a block diagram 200 of an exemplary wireless device, such as the wireless device 110. The wireless device includes a data processor/controller 210, a transceiver 218, and an antenna 290. The data processor/controller 210 may be referred to as a processing system. A processing system may include the data processor/controller 210 or both the data processor/controller 210 and the memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design illustrated in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. In an aspect, the exemplary baseband filter 160 may be implemented by one or more of the amplifier 258 and the RX baseband filter 260. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase-locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator 276 may generate a TX LO signal based on the TX VCO signal received from the TX frequency synthesizer 270. In an aspect, the exemplary ring oscillator 160 may be implemented by the VCO 274.

An RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280. In an aspect, the exemplary ring oscillator 160 may be implemented by the VCO 284.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer, 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 215 may receive the VCO signal(s) from the oscillator 214 and may generate clock signals for various modules within the data processor/controller 210 and/or the transceiver 218. The data processor/controller 210 may be implemented on one or more application-specific integrated circuits (ASICs) and/or other ICs.

The present disclosure provides an apparatus and method for controlling a voltage supply sensitivity of a ring oscillator.

Figure 3:
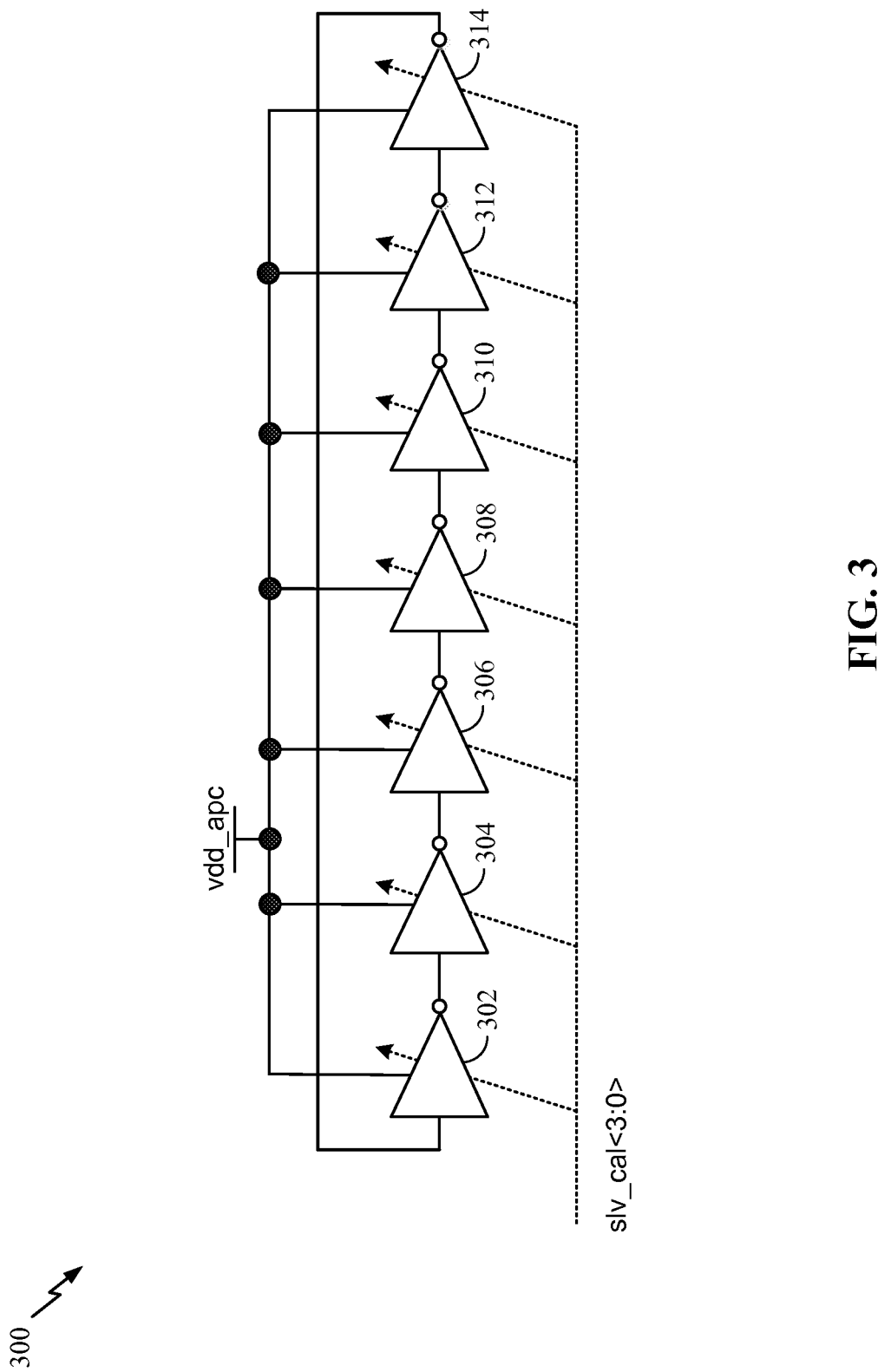
FIG. 3 illustrates a structure of a ring oscillator.

FIG. 3 illustrates a structure of a ring oscillator 300. In general, a ring oscillator is a device including an odd number of NOT gates whose output oscillates between two voltage levels, representing a "true" value and a "false" value. The NOT gates (which may also be referred to as inverters, delay stages, or stages) are attached in a chain; wherein an output of a last inverter is fed back to a first inverter. Referring to FIG. 3, a 7-stage ring oscillator is depicted. However, it is contemplated that the present disclosure may be implemented using any odd number of stages. The 7-stage ring oscillator includes a first inverter 302, a second inverter 304, a third inverter 306, a fourth inverter 308, a fifth inverter 310, a sixth inverter 312, and a seventh inverter 314. An output of the first inverter 302 is applied to an input of the second inverter 304. An output of the second inverter 304 is applied to an input of the third inverter 306. An output of the third inverter 306 is applied to an input of the fourth inverter 308. An output of the fourth inverter 308 is applied to an input of the fifth inverter 310. An output of the fifth inverter 310 is applied to an input of the sixth inverter 312. An output of the sixth inverter 312 is applied to an input of the seventh inverter 314. An output of the seventh inverter 314 is fed back to an input of the first inverter 302. A dashed arrow through each of the inverters of the 7-stage ring oscillator indicates that a respective inverter may be tuned as a function of a supply voltage vdd.

Figure 4:
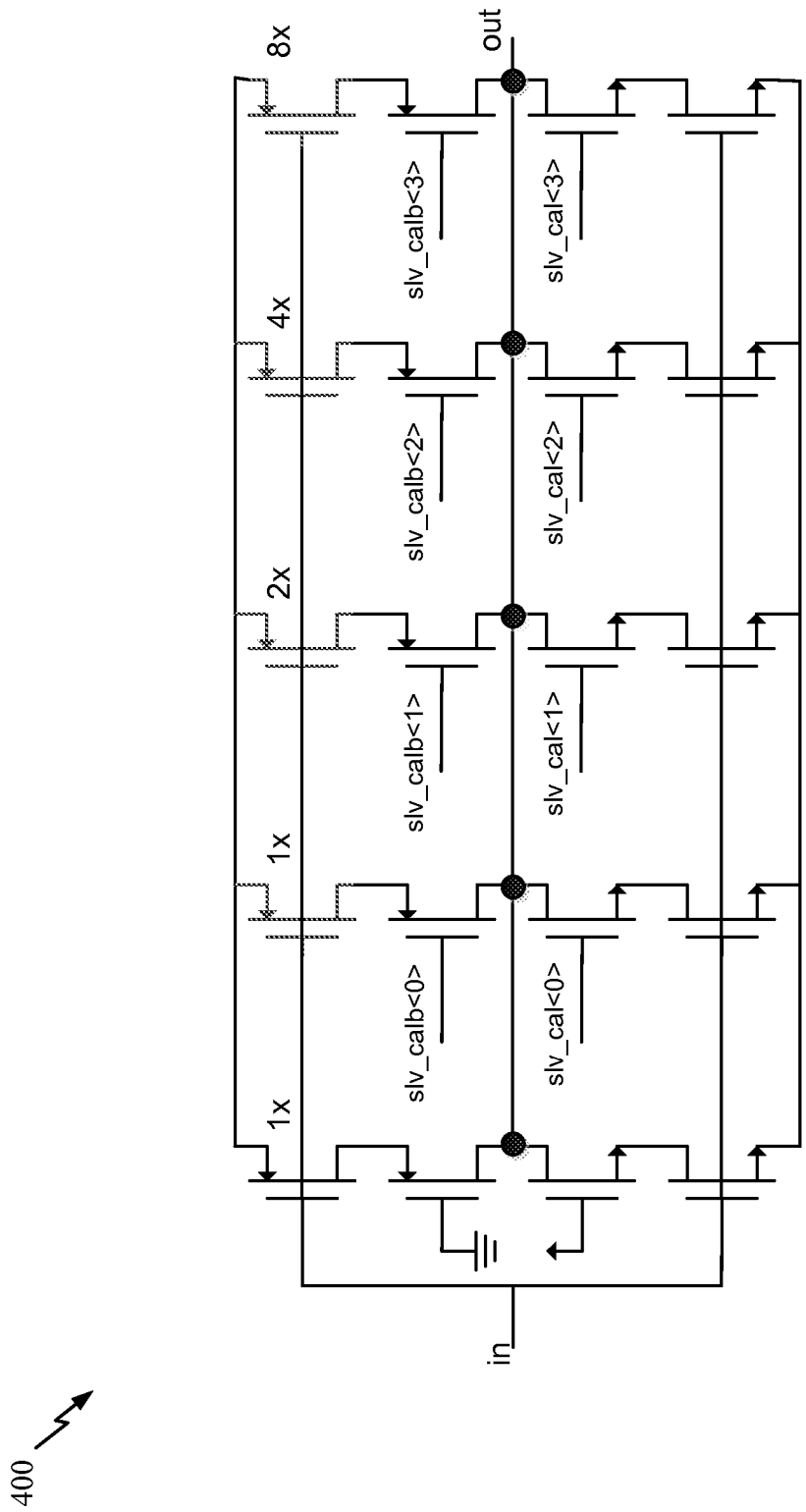
FIG. 4 is a transistor level schematic diagram of a single stage of a ring oscillator.

FIG. 4 is a transistor level schematic diagram 400 of a single stage of a ring oscillator. For example, the single stage may be equivalent to one of the first inverter 302, the second inverter 304, the third inverter 306, the fourth inverter 308, the fifth inverter 310, the sixth inverter 312, or the seventh inverter 314 of FIG. 3. The single stage may include a number of PMOS transistors and a number of NMOS transistors coupled together, as shown in FIG. 4.

Figure 5:
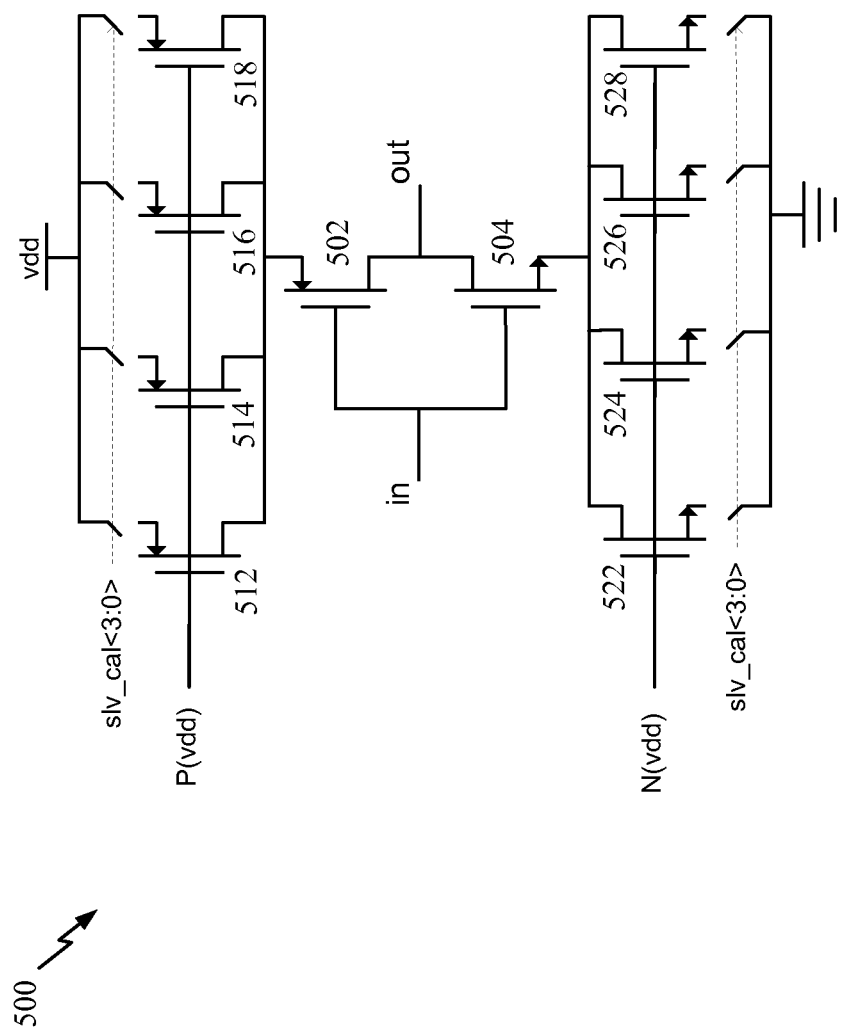
FIG. 5 is a transistor level schematic diagram of a single stage of a ring oscillator that is highly sensitive to a supply voltage.

FIG. 5 is a transistor level schematic diagram 500 of a single stage of a ring oscillator that is highly sensitive to a supply voltage. As an example, the single stage may be equivalent to one of the first inverter 302, the second inverter 304, the third inverter 306, the fourth inverter 308, the fifth inverter 310, the sixth inverter 312, or the seventh inverter 314 of FIG. 3.

In an aspect, the single stage may include a primary PMOS transistor 502 coupled to a primary NMOS transistor 504. A gate of the primary PMOS transistor 502 and a gate of the primary NMOS transistor 504 may be coupled to an input of the single stage. A drain of the primary PMOS transistor 502 and a drain of the primary NMOS transistor 504 may be coupled to an output of the single stage.

The primary PMOS transistor 502 may be coupled to a number of secondary PMOS transistors, e.g., a first secondary PMOS transistor 512, a second secondary PMOS transistor 514, a third secondary PMOS transistor 516, and a fourth secondary PMOS transistor 518. For example, a source of the primary PMOS transistor 502 may be coupled to a drain of the first secondary PMOS transistor 512, a drain of the second secondary PMOS transistor 514, a drain of the third secondary PMOS transistor 516, and a drain of the fourth secondary PMOS transistor 518. Moreover, a source of the first secondary PMOS transistor 512, a source of the second secondary PMOS transistor 514, a source of the third secondary PMOS transistor 516, and a source of the fourth secondary PMOS transistor 518 may be coupled to a voltage source vdd via respective switches. In an aspect, a resistance of each of the first secondary PMOS transistor 512, the second secondary PMOS transistor 514, the third secondary PMOS transistor 516, and the fourth secondary PMOS transistor 518 may be tuned as a function of the supply voltage (vdd) by respectively receiving a biasing signal P(vdd) from a biasing module. Each of the first secondary PMOS transistor 512, the second secondary PMOS transistor 514, the third secondary PMOS transistor 516, and the fourth secondary PMOS transistor 518 may receive the biasing signal P(vdd) via a respective gate node.

The primary NMOS transistor 504 may be coupled to a number of secondary NMOS transistors, e.g., a first secondary NMOS transistor 522, a second secondary NMOS transistor 524, a third secondary NMOS transistor 526, and a fourth secondary NMOS transistor 528. For example, a source of the primary NMOS transistor 504 may be coupled to a drain of the first secondary NMOS transistor 522, a drain of the second secondary NMOS transistor 524, a drain of the third secondary NMOS transistor 526, and a drain of the fourth secondary NMOS transistor 528. Moreover, a source of the first secondary NMOS transistor 522, a source of the second secondary NMOS transistor 524, a source of the third secondary NMOS transistor 526, and a source of the fourth secondary NMOS transistor 528 may be coupled to a ground node via respective switches. In an aspect, a resistance of each of the first secondary NMOS transistor 522, the second secondary NMOS transistor 524, the third secondary NMOS transistor 526, and the fourth secondary NMOS transistor 528 may be tuned as a function of the supply voltage (vdd) by respectively receiving a biasing signal N(vdd) from a biasing module. Each of the first secondary NMOS transistor 522, the second secondary NMOS transistor 524, the third secondary NMOS transistor 526, and the fourth secondary NMOS transistor 528 may receive the biasing signal N(vdd) via a respective gate node.

In an aspect, the voltage-controlled transistors (secondary PMOS transistors 512, 514, 516, 518 and secondary NMOS transistors 522, 524, 526, 528) of FIG. 5 may be used as degeneration for the single stage of the ring oscillator, wherein the resistance of each of the voltage-controlled transistors is a strong function of the supply voltage (vdd). The voltage-controlled transistors may be tuned as a function of vdd to control the sensitivity of the ring oscillator to vdd. Hence, the ring oscillator can be tuned to be more or less sensitive to the supply voltage. In case the ring oscillator is tuned to be more sensitive to the supply voltage, it can more easily detect supply variation.

Figure 6:
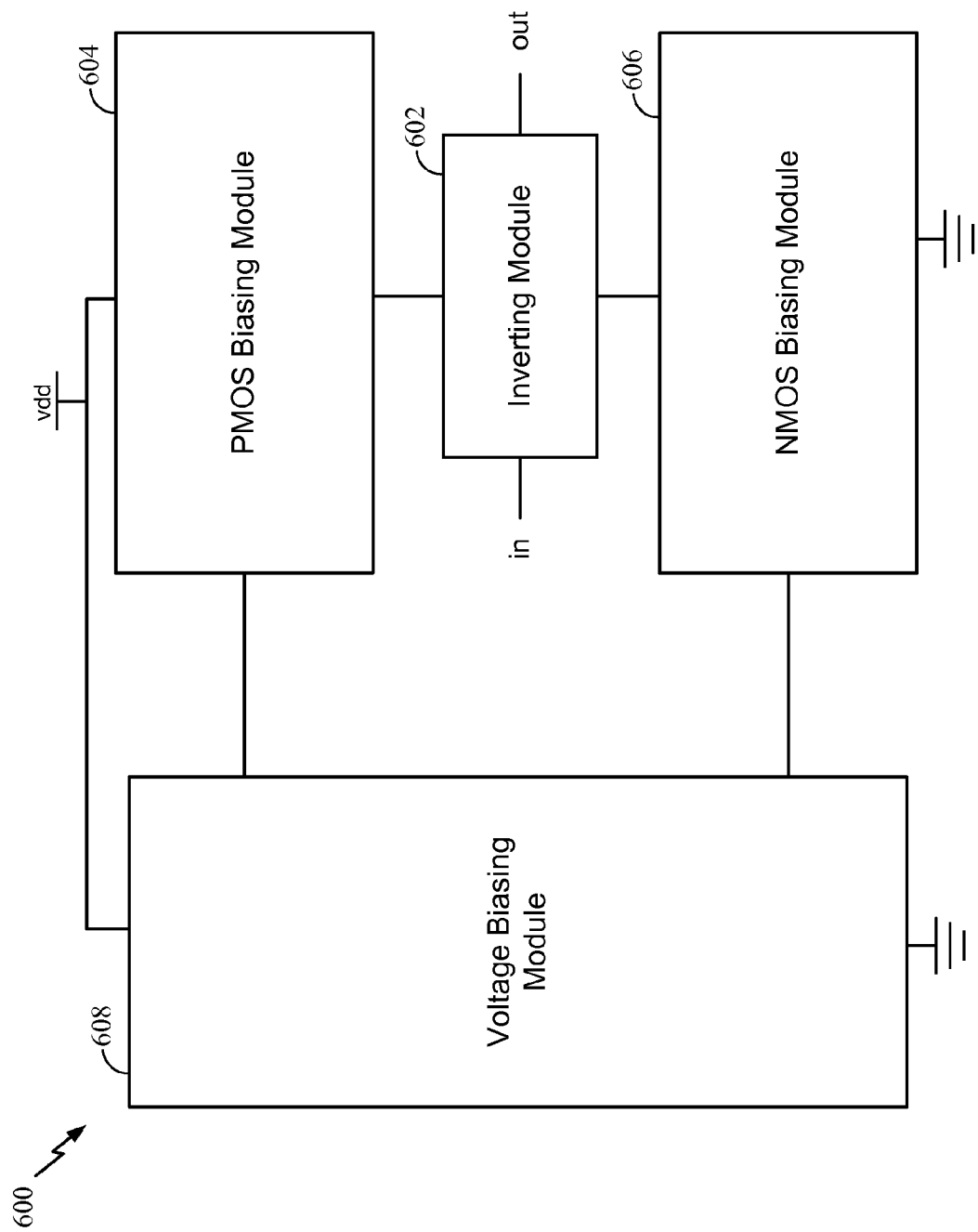
FIG. 6 is a module diagram of a single stage of a ring oscillator that is highly sensitive to a supply voltage.
Figure 7:
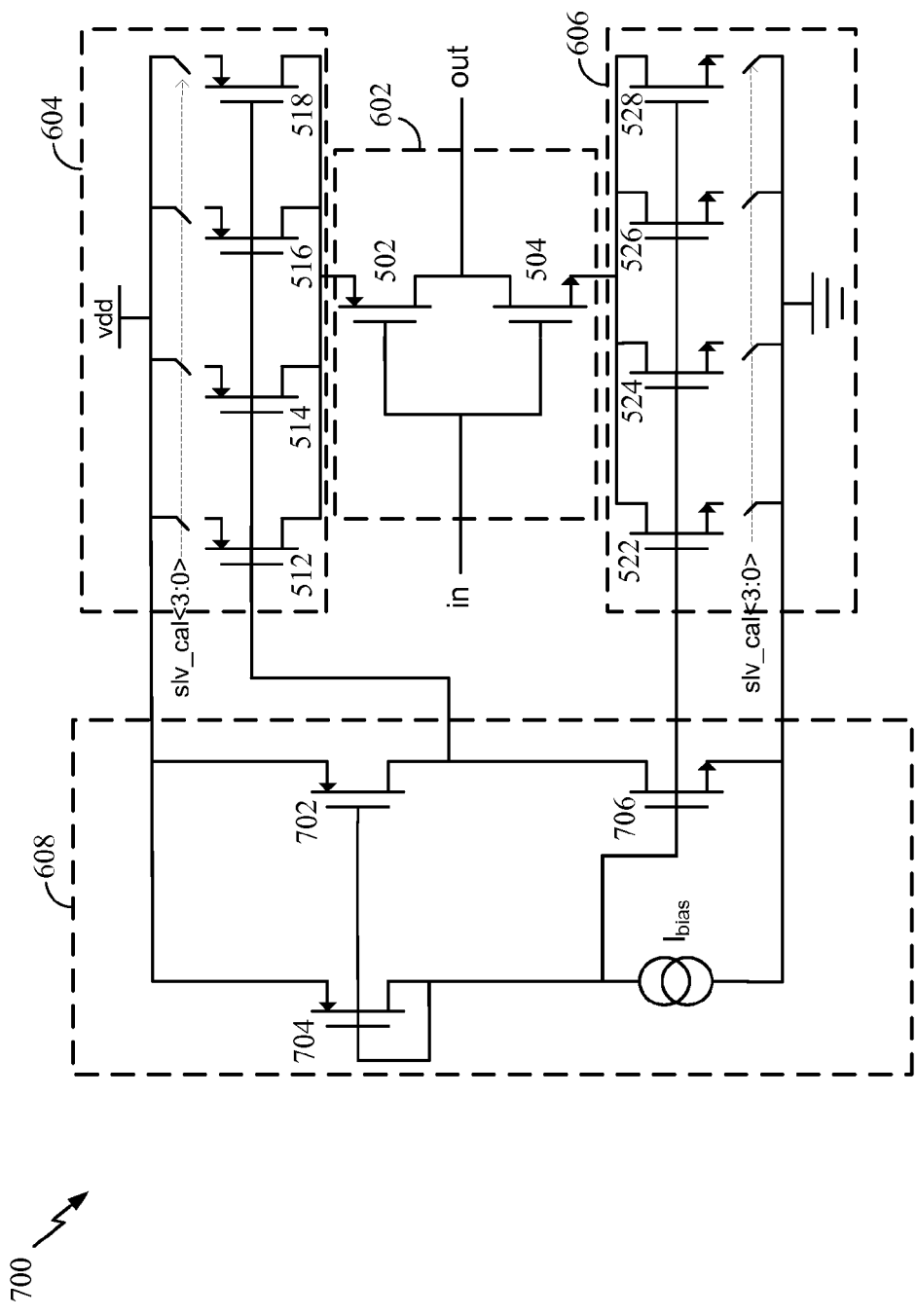
FIG. 7 is a transistor level schematic diagram of the single stage of FIG. 6.

FIG. 6 is a module diagram 600 of a single stage of a ring oscillator that is highly sensitive to a supply voltage. As an example, the single stage may be equivalent to one of the first inverter 302, the second inverter 304, the third inverter 306, the fourth inverter 308, the fifth inverter 310, the sixth inverter 312, or the seventh inverter 314 of FIG. 3. FIG. 7 is a transistor level schematic diagram 700 of the single stage of FIG. 6.

Referring to FIGS. 6 and 7, the single stage includes an inverting module 602, a PMOS biasing module 604, an NMOS biasing module 606, and a voltage biasing module 608. In an aspect, the voltage biasing module controls a bias voltage for the single stage. For example, the voltage biasing module 608 generates a bias signal for the PMOS biasing module 604 based on a supply voltage (vdd) and sends the bias signal to the PMOS biasing module 604. Upon receiving the bias signal, the PMOS biasing module 604 may bias triode PMOS degeneration of the inverting module 602. In another example, the voltage biasing module 608 generates a bias signal for the NMOS biasing module 606 based on the supply voltage (vdd) and sends the bias signal to the NMOS biasing module 606. Upon receiving the bias signal, the NMOS biasing module 606 may bias triode NMOS degeneration of the inverting module 602. The inverting module 602 may then operate to output an inverted version (logical NOT) of a received input based on the biased triode NMOS degeneration and the biased triode PMOS degeneration.

In an aspect, by implementing the single stage as shown in FIGS. 6 and 7, active high bandwidth biasing may be achieved, which allows for faster transition of supply voltage and/or fast resistance changes with respect to supply transients. Accordingly, the ring oscillator implementing such a single stage will have increased supply sensitivity. For example, the supply sensitivity may be increased by 1 to 3 times over previous ring oscillator designs.

Still referring to FIGS. 6 and 7, inverting module 602 may include a primary PMOS transistor 502 coupled to a primary NMOS transistor 504. A gate of the primary PMOS transistor 502 and a gate of the primary NMOS transistor 504 may be coupled to an input of the single stage. A drain of the primary PMOS transistor 502 and a drain of the primary NMOS transistor 504 may be coupled to an output of the single stage.

The primary PMOS transistor 502 may be coupled to the PMOS biasing module 604. The PMOS biasing module 604 may include a number of secondary PMOS transistors, e.g., a first secondary PMOS transistor 512, a second secondary PMOS transistor 514, a third secondary PMOS transistor 516, and a fourth secondary PMOS transistor 518. A source of the primary PMOS transistor 502 may be coupled to a drain of the first secondary PMOS transistor 512, a drain of the second secondary PMOS transistor 514, a drain of the third secondary PMOS transistor 516, and a drain of the fourth secondary PMOS transistor 518. Moreover, a source of the first secondary PMOS transistor 512, a source of the second secondary PMOS transistor 514, a source of the third secondary PMOS transistor 516, and a source of the fourth secondary PMOS transistor 518 may be coupled to a voltage source vdd via respective switches. A resistance of each of the first secondary PMOS transistor 512, the second secondary PMOS transistor 514, the third secondary PMOS transistor 516, and the fourth secondary PMOS transistor 518 may be tuned as a function of the supply voltage (vdd) by respectively receiving a bias signal from the voltage biasing module 608. Each of the first secondary PMOS transistor 512, the second secondary PMOS transistor 514, the third secondary PMOS transistor 516, and the fourth secondary PMOS transistor 518 may receive the bias signal via a respective gate node.

The primary NMOS transistor 504 may be coupled to the NMOS biasing module 606. The NMOS biasing module 606 may include a number of secondary NMOS transistors, e.g., a first secondary NMOS transistor 522, a second secondary NMOS transistor 524, a third secondary NMOS transistor 526, and a fourth secondary NMOS transistor 528. A source of the primary NMOS transistor 504 may be coupled to a drain of the first secondary NMOS transistor 522, a drain of the second secondary NMOS transistor 524, a drain of the third secondary NMOS transistor 526, and a drain of the fourth secondary NMOS transistor 528. Moreover, a source of the first secondary NMOS transistor 522, a source of the second secondary NMOS transistor 524, a source of the third secondary NMOS transistor 526, and a source of the fourth secondary NMOS transistor 528 may be coupled to a ground node via respective switches. In an aspect, a resistance of each of the first secondary NMOS transistor 522, the second secondary NMOS transistor 524, the third secondary NMOS transistor 526, and the fourth secondary NMOS transistor 528 may be tuned as a function of the supply voltage (vdd) by respectively receiving a bias signal from voltage biasing module 608. Each of the first secondary NMOS transistor 522, the second secondary NMOS transistor 524, the third secondary NMOS transistor 526, and the fourth secondary NMOS transistor 528 may receive the bias signal via a respective gate node.

The voltage biasing module 608 may include a first PMOS transistor 702, a second PMOS transistor 704, an NMOS transistor 706, and a current source $I_{bias}$. A drain of the first PMOS transistor 702 is coupled to a drain of the NMOS transistor 706. The drain of the first PMOS transistor 702 is further coupled to the gate of the first secondary PMOS transistor 512, the gate of the second secondary PMOS transistor 514, the gate of the third secondary PMOS transistor 516, and the gate of the fourth secondary PMOS transistor 518. A source of the first PMOS transistor 702 is coupled to the supply voltage (vdd). A gate of the first PMOS transistor 702 is coupled to a gate of the second PMOS transistor 704.

A source of the second PMOS transistor 704 is coupled to the supply voltage (vdd). A drain of the second PMOS transistor 704 is coupled to a first node of the current source $I_{bias}$ and a gate of the NMOS transistor 706. The drain of the second PMOS transistor 704 is further coupled to the gate of the second PMOS transistor 704.

A drain of the NMOS transistor 706 is coupled to the drain of the first PMOS transistor 702. The drain of the NMOS transistor 706 is further coupled to the gate of the first secondary PMOS transistor 512, the gate of the second secondary PMOS transistor 514, the gate of the third secondary PMOS transistor 516, and the gate of the fourth secondary PMOS transistor 518. A source of the NMOS transistor 706 is coupled to the ground node. A gate of the NMOS transistor 706 is coupled to the first node of the current source $I_{bias}$. The gate of the NMOS transistor 706 is further coupled to the gate of the first secondary NMOS transistor 522, the gate of the second secondary NMOS transistor 524, the gate of the third secondary NMOS transistor 526, and the gate of the fourth secondary NMOS transistor 528.

The first node of the current source $I_{bais}$ is coupled to the drain of the second PMOS transistor 704 and the gate of the NMOS transistor 706. A second node of the current source $I_{bias}$ is coupled to the ground node.

In an aspect, a ring oscillator implementing a stage as shown in FIGS. 6 and 7 may be deployed in a droop detector system. As described above, the ring oscillator of the present disclosure using voltage-controlled transistors within a stage achieves better supply sensitivity. Supply sensitivity may increase by 40% with a 20% power reduction as compared with previous ring oscillator designs. Accordingly, a resolution of the droop detector system implementing the ring oscillator of the present disclosure may drop to 11.9 mV while traditional droop detector designs may have a resolution of 17.1 mV.

Figure 8:
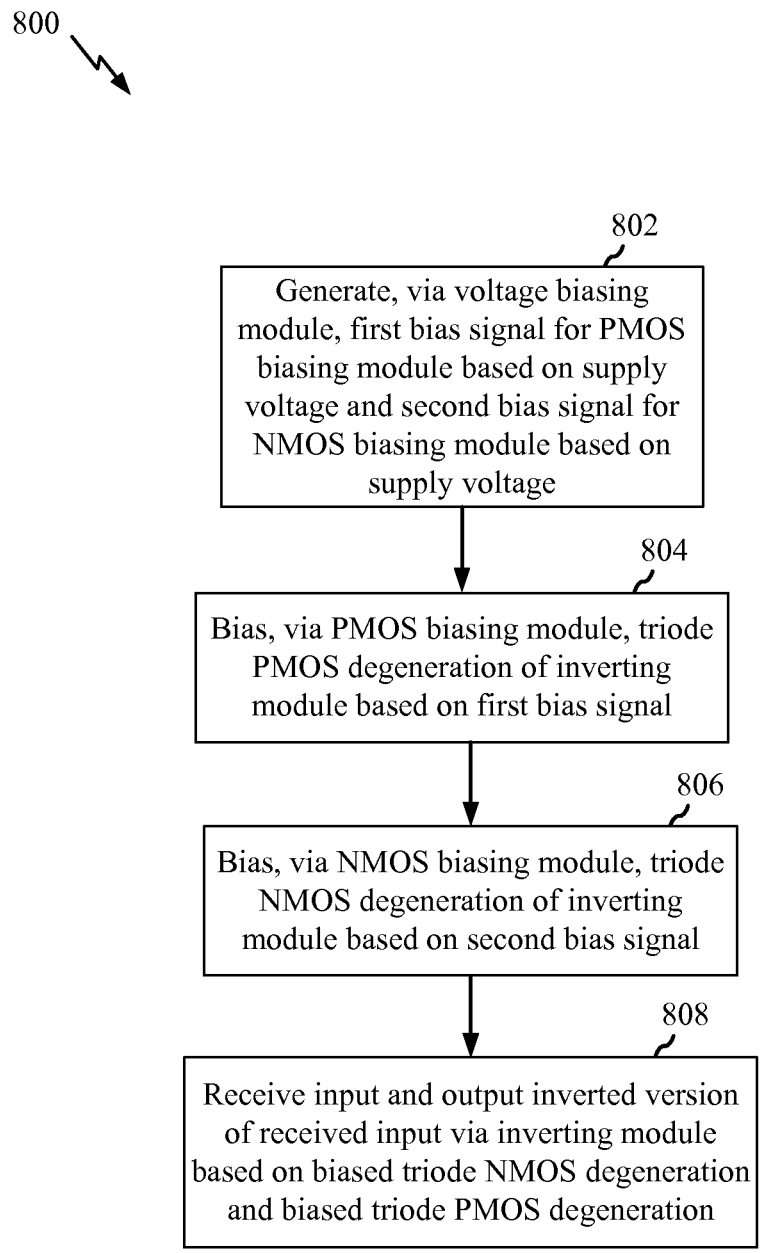
FIG. 8 is a flow chart of a method for controlling a supply sensitivity of a ring oscillator stage.

FIG. 8 is a flow chart of a method for controlling a supply sensitivity of a ring oscillator stage. The method may be performed by an apparatus (e.g., ring oscillator 160 or ring oscillator stage of FIGS. 6 and 7).

At block 802, the apparatus generates, via a voltage biasing module, a first bias signal for a PMOS biasing module based on a supply voltage. The apparatus further generates, via the voltage biasing module, a second bias signal for an NMOS biasing module based on the supply voltage.

At block 804, the apparatus biases, via the PMOS biasing module, triode PMOS degeneration of the inverting module based on the first bias signal. At block 806, the apparatus biases, via the NMOS biasing module, triode NMOS degeneration of the inverting module based on the second bias signal.

At block 808, the apparatus receives an input via an inverting module. Thereafter, the apparatus outputs, via the inverting module, an inverted version of the received input based on the biased triode NMOS degeneration and the biased triode PMOS degeneration.

In an aspect, the inverting module includes a primary PMOS transistor and a primary NMOS transistor coupled to the primary PMOS transistor. A gate of the primary PMOS transistor and a gate of the primary NMOS transistor are coupled to an input of the ring oscillator stage. A drain of the primary PMOS transistor and a drain of the primary NMOS transistor are coupled to an output of the ring oscillator stage.

In a further aspect, the PMOS biasing module includes a first secondary PMOS transistor, a second secondary PMOS transistor, a third secondary PMOS transistor, and a fourth secondary PMOS transistor. A source of the primary PMOS transistor is coupled to a drain of the first secondary PMOS transistor, a drain of the second secondary PMOS transistor, a drain of the third secondary PMOS transistor, and a drain of the fourth secondary PMOS transistor. A source of the first secondary PMOS transistor, a source of the second secondary PMOS transistor, a source of the third secondary PMOS transistor, and a source of the fourth secondary PMOS transistor is coupled to the supply voltage. A resistance of each of the first secondary PMOS transistor, the second secondary PMOS transistor, the third secondary PMOS transistor, and the fourth secondary PMOS transistor is controlled based on the supply voltage by respectively receiving the first bias signal from the voltage biasing module. Each of the first secondary PMOS transistor, the second secondary PMOS transistor, the third secondary PMOS transistor, and the fourth secondary PMOS transistor receives the first bias signal via a respective gate node.

In another aspect, the NMOS biasing module includes a first secondary NMOS transistor, a second secondary NMOS transistor, a third secondary NMOS transistor, and a fourth secondary NMOS transistor. A source of the primary NMOS transistor is coupled to a drain of the first secondary NMOS transistor, a drain of the second secondary NMOS transistor, a drain of the third secondary NMOS transistor, and a drain of the fourth secondary NMOS transistor. A source of the first secondary NMOS transistor, a source of the second secondary NMOS transistor, a source of the third secondary NMOS transistor, and a source of the fourth secondary NMOS transistor is coupled to a ground node. A resistance of each of the first secondary NMOS transistor, the second secondary NMOS transistor, the third secondary NMOS transistor, and the fourth secondary NMOS transistor 528 is controlled based on the supply voltage by respectively receiving the second bias signal from voltage biasing module. Each of the first secondary NMOS transistor, the second secondary NMOS transistor, the third secondary NMOS transistor, and the fourth secondary NMOS transistor receives the second bias signal via a respective gate node.

In an aspect, the voltage biasing module includes a first tertiary PMOS transistor, a second tertiary PMOS transistor, a tertiary NMOS transistor, and a current source. A drain of the first tertiary PMOS transistor is coupled to a drain of the tertiary NMOS transistor and coupled to the gate of the first secondary PMOS transistor, the gate of the second secondary PMOS transistor, the gate of the third secondary PMOS transistor, and the gate of the fourth secondary PMOS transistor. A source of the first tertiary PMOS transistor is coupled to the supply voltage. A gate of the first tertiary PMOS transistor is coupled to a gate of the second tertiary PMOS transistor.

In a further aspect, a source of the second tertiary PMOS transistor is coupled to the supply voltage. A drain of the second tertiary PMOS transistor is coupled to a first node of the current source and a gate of the tertiary NMOS transistor and coupled to the gate of the second tertiary PMOS transistor.

In another aspect, a drain of the tertiary NMOS transistor is coupled to the drain of the first tertiary PMOS transistor and coupled to the gate of the first secondary PMOS transistor, the gate of the second secondary PMOS transistor, the gate of the third secondary PMOS transistor, and the gate of the fourth secondary PMOS transistor. A source of the tertiary NMOS transistor is coupled to the ground node. A gate of the tertiary NMOS transistor is coupled to the first node of the current source and coupled to the gate of the first secondary NMOS transistor, the gate of the second secondary NMOS transistor, the gate of the third secondary NMOS transistor, and the gate of the fourth secondary NMOS transistor.

In an aspect, the first node of the current source is coupled to the drain of the second tertiary PMOS transistor and the gate of the tertiary NMOS transistor. A second node of the current source is coupled to the ground node.

Referring again to FIGS. 6 and 7, an apparatus (e.g., ring oscillator 160 or ring oscillator stage of FIGS. 6 and 7) may include one or more of the inverting module 602, the PMOS biasing module 604, the NMOS biasing module 606, the voltage biasing module 608, and the circuit elements described above corresponding to the respective modules. The apparatus includes inverting means for receiving an input and outputting an inverted version of the received input. The apparatus further includes PMOS biasing means for biasing triode PMOS degeneration of the inverting means and NMOS biasing means for biasing triode NMOS degeneration of the inverting means. The apparatus also includes voltage biasing means for generating a first bias signal for the PMOS biasing means based on a supply voltage and a second bias signal for the NMOS biasing means based on the supply voltage. The PMOS biasing means is configured to bias the triode PMOS degeneration of the inverting means based on the first bias signal. The NMOS biasing means is configured to bias the triode NMOS degeneration of the inverting means based on the second bias signal. The inverted version of the received input is outputted via the inverting means based on the biased triode NMOS degeneration and the biased triode PMOS degeneration. The aforementioned means may be one or more of the inverting module 602, the PMOS biasing module 604, the NMOS biasing module 606, the voltage biasing module 608, the circuit elements corresponding to the respective modules, the data processor/controller 210, the computer-readable medium, i.e., the memory 212, and/or the computer-readable medium, i.e., the memory 216 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. An apparatus for controlling a supply sensitivity of a ring oscillator stage, comprising:
  an inverting module configured to output an inverted version of a received input;
  a PMOS biasing module coupled to the inverting module and comprising at least one element having a tunable resistance based on a first bias signal;
  an NMOS biasing module coupled to the inverting module and comprising at least one element having a tunable resistance based on a second bias signal; and
  a voltage biasing module configured to generate the first bias signal for the PMOS biasing module based on a supply voltage and generate the second bias signal for the NMOS biasing module based on the supply voltage, the voltage biasing module comprising a first PMOS transistor, an NMOS transistor, a second PMOS transistor, and a current source, wherein a drain of the first PMOS transistor is coupled to a drain of the NMOS transistor and to the PMOS biasing module, wherein a gate of the NMOS transistor is coupled to the NMOS biasing module, and wherein a gate of the first PMOS transistor is coupled to a gate of the second PMOS transistor,
  wherein a source of the first PMOS transistor is coupled to the supply voltage,
  wherein a source of the second PMOS transistor is coupled to the supply voltage,
  wherein a drain of the second PMOS transistor is coupled to a first node of the current source and the gate of the NMOS transistor and coupled to the gate of the second PMOS transistor,
  wherein the PMOS biasing module biases the inverting module based on the first bias signal,
  wherein the NMOS biasing module biases the inverting module based on the second bias signal, and
  wherein the inverting module outputs the inverted version of the received input based on the NMOS biasing module bias and the PMOS biasing module bias.

2. The apparatus of claim 1, wherein the inverting module comprises:
  a primary PMOS transistor; and
  a primary NMOS transistor coupled to the primary PMOS transistor,
  wherein a gate of the primary PMOS transistor and a gate of the primary NMOS transistor is coupled to an input of the ring oscillator stage, and
  wherein a drain of the primary PMOS transistor and a drain of the primary NMOS transistor are coupled to an output of the ring oscillator stage.

3. The apparatus of claim 2, wherein the PMOS biasing module comprises a first secondary PMOS transistor, a second secondary PMOS transistor, a third secondary PMOS transistor, and a fourth secondary PMOS transistor,
  wherein a source of the primary PMOS transistor is coupled to a drain of the first secondary PMOS transistor, a drain of the second secondary PMOS transistor, a drain of the third secondary PMOS transistor, and a drain of the fourth secondary PMOS transistor,
  wherein a source of the first secondary PMOS transistor, a source of the second secondary PMOS transistor, a source of the third secondary PMOS transistor, and a source of the fourth secondary PMOS transistor is coupled to the supply voltage,
  wherein a resistance of each of the first secondary PMOS transistor, the second secondary PMOS transistor, the third secondary PMOS transistor, and the fourth secondary PMOS transistor is controlled based on the supply voltage by respectively receiving the first bias signal from the voltage biasing module, and
  wherein each of the first secondary PMOS transistor, the second secondary PMOS transistor, the third secondary PMOS transistor, and the fourth secondary PMOS transistor receives the first bias signal via a respective gate node.

4. The apparatus of claim 3, wherein the NMOS biasing module comprises a first secondary NMOS transistor, a second secondary NMOS transistor, a third secondary NMOS transistor, and a fourth secondary NMOS transistor,
  wherein a source of the primary NMOS transistor is coupled to a drain of the first secondary NMOS transistor, a drain of the second secondary NMOS transistor, a drain of the third secondary NMOS transistor, and a drain of the fourth secondary NMOS transistor,
  wherein a source of the first secondary NMOS transistor, a source of the second secondary NMOS transistor, a source of the third secondary NMOS transistor, and a source of the fourth secondary NMOS transistor is coupled to a ground node, wherein a resistance of each of the first secondary NMOS transistor, the second secondary NMOS transistor, the third secondary NMOS transistor, and the fourth secondary NMOS transistor is controlled based on the supply voltage by respectively receiving the second bias signal from voltage biasing module, and wherein each of the first secondary NMOS transistor, the second secondary NMOS transistor, the third secondary NMOS transistor, and the fourth secondary NMOS transistor receives the second bias signal via a respective gate node.

5. The apparatus of claim 4,
wherein the drain of the first PMOS transistor is coupled to the gate of the first secondary PMOS transistor, the gate of the second secondary PMOS transistor, the gate of the third secondary PMOS transistor, and the gate of the fourth secondary PMOS transistor.

6. The apparatus of claim 5,
wherein the drain of the NMOS transistor is coupled to the gate of the first secondary PMOS transistor, the gate of the second secondary PMOS transistor, the gate of the third secondary PMOS transistor, and the gate of the fourth secondary PMOS transistor,
wherein a source of the NMOS transistor is coupled to the ground node, and
wherein the gate of the NMOS transistor is coupled to the gate of the first secondary NMOS transistor, the gate of the second secondary NMOS transistor, the gate of the third secondary NMOS transistor, and the gate of the fourth secondary NMOS transistor.

7. The apparatus of claim 6,
wherein a second node of the current source is coupled to the ground node.

8. The apparatus of claim 1, wherein the supply sensitivity is based at least in part on the tuned resistance of the at least one element of the PMOS biasing module and the tuned resistance of the at least one element of the NMOS biasing module.

9. The apparatus of claim 1, wherein the at least one element of the PMOS biasing module and the at least one element of the NMOS biasing module provide degeneration for the inverting module.

10. The apparatus of claim 1, wherein the PMOS biasing module and the NMOS biasing module each comprise a plurality of elements having a tunable resistance, wherein each of the plurality of elements comprises a transistor in series with a switch.

11. The apparatus of claim 1, wherein a second node of the current source is coupled to a source of the NMOS transistor.

12. The apparatus of claim 11, wherein the source of the first PMOS transistor is further coupled to one or more switches in the PMOS biasing module, and wherein the source of the NMOS transistor is further coupled to one or more switches in the NMOS biasing module.

13. A method for controlling a supply sensitivity of a ring oscillator stage, comprising:
generating, via a voltage biasing module, a first bias signal for a PMOS biasing module based on a supply voltage and a second bias signal for an NMOS biasing module based on the supply voltage, the first bias signal being provided from a node to which a drain of an NMOS transistor and a drain of a first PMOS transistor in the voltage biasing module are coupled, the second biasing signal being provided from a node coupled to a gate of the NMOS transistor, wherein the drain of the first PMOS transistor is not connected to a gate of the first PMOS transistor, wherein the voltage biasing module further comprises a second PMOS transistor and a current source; a source of the first PMOS transistor is coupled to the supply voltage, and the gate of the first PMOS transistor is coupled to a gate of the second PMOS transistor, wherein a source of the second PMOS transistor is coupled to the supply voltage, and wherein a drain of the second PMOS transistor is coupled to a first node of the current source and the gate of the NMOS transistor and coupled to the gate of the second PMOS transistor, tuning a resistance of at least one element of the PMOS biasing module based on the first bias signal;

tuning a resistance of at least one element of the NMOS biasing module based on the second bias signal;

biasing, via the PMOS biasing module, PMOS degeneration of an inverting module based on the tuned resistance of the at least one element of the PMOS biasing module;

biasing, via the NMOS biasing module, NMOS degeneration of the inverting module based on the tuned resistance of the at least one element of the NMOS biasing module;

receiving an input via the inverting module; and outputting, via the inverting module, an inverted version of the received input based on the NMOS degeneration and the PMOS degeneration.

14. The method of claim 13, wherein the inverting module comprises:
a primary PMOS transistor; and
a primary NMOS transistor coupled to the primary PMOS transistor,
wherein a gate of the primary PMOS transistor and a gate of the primary NMOS transistor is coupled to an input of the ring oscillator stage, and
wherein a drain of the primary PMOS transistor and a drain of the primary NMOS transistor are coupled to an output of the ring oscillator stage.

15. The method of claim 14, wherein the PMOS biasing module comprises a first secondary PMOS transistor, a second secondary PMOS transistor, a third secondary PMOS transistor, and a fourth secondary PMOS transistor,
wherein a source of the primary PMOS transistor is coupled to a drain of the first secondary PMOS transistor, a drain of the second secondary PMOS transistor, a drain of the third secondary PMOS transistor, and a drain of the fourth secondary PMOS transistor,
wherein a source of the first secondary PMOS transistor, a source of the second secondary PMOS transistor, a source of the third secondary PMOS transistor, and a source of the fourth secondary PMOS transistor is coupled to the supply voltage,
wherein a resistance of each of the first secondary PMOS transistor, the second secondary PMOS transistor, the third secondary PMOS transistor, and the fourth secondary PMOS transistor is controlled based on the supply voltage by respectively receiving the first bias signal from the voltage biasing module, and
wherein each of the first secondary PMOS transistor, the second secondary PMOS transistor, the third secondary PMOS transistor, and the fourth secondary PMOS transistor receives the first bias signal via a respective gate node.

16. The method of claim 15, wherein the NMOS biasing module comprises a first secondary NMOS transistor, a second secondary NMOS transistor, a third secondary NMOS transistor, and a fourth secondary NMOS transistor,
- wherein a source of the primary NMOS transistor is coupled to a drain of the first secondary NMOS transistor, a drain of the second secondary NMOS transistor, a drain of the third secondary NMOS transistor, and a drain of the fourth secondary NMOS transistor,
- wherein a source of the first secondary NMOS transistor, a source of the second secondary NMOS transistor, a source of the third secondary NMOS transistor, and a source of the fourth secondary NMOS transistor is coupled to a ground node,
- wherein a resistance of each of the first secondary NMOS transistor, the second secondary NMOS transistor, the third secondary NMOS transistor, and the fourth secondary NMOS transistor is controlled based on the supply voltage by respectively receiving the second bias signal from voltage biasing module, and
- wherein each of the first secondary NMOS transistor, the second secondary NMOS transistor, the third secondary NMOS transistor, and the fourth secondary NMOS transistor receives the second bias signal via a respective gate node.

17. The method of claim 16,
- wherein the drain of the first PMOS transistor is coupled to the gate of the first secondary PMOS transistor, the gate of the second secondary PMOS transistor, the gate of the third secondary PMOS transistor, and the gate of the fourth secondary PMOS transistor.

18. The method of claim 17,
- wherein the drain of the NMOS transistor is coupled to the gate of the first secondary PMOS transistor, the gate of the second secondary PMOS transistor, the gate of the third secondary PMOS transistor, and the gate of the fourth secondary PMOS transistor,
- wherein a source of the NMOS transistor is coupled to the ground node, and
- wherein the gate of the NMOS transistor is coupled to the gate of the first secondary NMOS transistor, the gate of the second secondary NMOS transistor, the gate of the third secondary NMOS transistor, and the gate of the fourth secondary NMOS transistor.

19. The method of claim 18,
- wherein a second node of the current source is coupled to the ground node.

20. An apparatus for controlling a supply sensitivity of a ring oscillator stage, comprising:
- inverting means for receiving an input and outputting an inverted version of the received input;
- PMOS biasing means for biasing PMOS degeneration of the inverting means, the PMOS biasing means comprising means for tuning a resistance of the PMOS biasing means based on a first bias signal;
- NMOS biasing means for biasing NMOS degeneration of the inverting means, the NMOS biasing means comprising means for tuning a resistance of the NMOS biasing means based on a second bias signal; and
- voltage biasing means for generating the first bias signal for the PMOS biasing means based on a supply voltage and the second bias signal for the NMOS biasing means based on the supply voltage, the voltage biasing means comprising a first PMOS transistor, an NMOS transistor, a second PMOS transistor and means for providing a current comprising a current source, wherein a drain of the first PMOS transistor is coupled to a drain of the NMOS transistor and to the PMOS biasing means, wherein a gate of the NMOS transistor is coupled to the NMOS biasing means, and wherein a source of the NMOS transistor is coupled to the means for providing current, and
- wherein a source of the first PMOS transistor is coupled to the supply voltage and the gate of the first PMOS transistor is coupled to a gate of the second PMOS transistor,
- wherein a source of the second PMOS transistor is coupled to the supply voltage,
- wherein a drain of the second PMOS transistor is coupled to a first node of the current source and the gate of the NMOS transistor and coupled to the gate of the second PMOS transistor, and
- wherein the inverted version of the received input is outputted via the inverting means based on the biased NMOS degeneration and the biased PMOS degeneration.

21. The apparatus of claim 20, wherein the inverting means comprises:
- a primary PMOS transistor; and
- a primary NMOS transistor coupled to the primary PMOS transistor,
- wherein a gate of the primary PMOS transistor and a gate of the primary NMOS transistor is coupled to an input of the ring oscillator stage, and
- wherein a drain of the primary PMOS transistor and a drain of the primary NMOS transistor are coupled to an output of the ring oscillator stage.

22. The apparatus of claim 21, wherein the PMOS biasing means comprises a first secondary PMOS transistor, a second secondary PMOS transistor, a third secondary PMOS transistor, and a fourth secondary PMOS transistor,
- wherein a source of the primary PMOS transistor is coupled to a drain of the first secondary PMOS transistor, a drain of the second secondary PMOS transistor, a drain of the third secondary PMOS transistor, and a drain of the fourth secondary PMOS transistor,
- wherein a source of the first secondary PMOS transistor, a source of the second secondary PMOS transistor, a source of the third secondary PMOS transistor, and a source of the fourth secondary PMOS transistor is coupled to the supply voltage,
- wherein a resistance of each of the first secondary PMOS transistor, the second secondary PMOS transistor, the third secondary PMOS transistor, and the fourth secondary PMOS transistor is controlled based on the supply voltage by respectively receiving the first bias signal from the voltage biasing module, and
- wherein each of the first secondary PMOS transistor, the second secondary PMOS transistor, the third secondary PMOS transistor, and the fourth secondary PMOS transistor receives the first bias signal via a respective gate node.

23. The apparatus of claim 22, wherein the NMOS biasing means comprises a first secondary NMOS transistor, a second secondary NMOS transistor, a third secondary NMOS transistor, and a fourth secondary NMOS transistor,
- wherein a source of the primary NMOS transistor is coupled to a drain of the first secondary NMOS transistor, a drain of the second secondary NMOS transistor, a drain of the third secondary NMOS transistor, and a drain of the fourth secondary NMOS transistor,
- wherein a source of the first secondary NMOS transistor, a source of the second secondary NMOS transistor, a source of the third secondary NMOS transistor, and a source of the fourth secondary NMOS transistor is coupled to a ground node, wherein a resistance of each of the first secondary NMOS transistor, the second secondary NMOS transistor, the third secondary NMOS transistor, and the fourth secondary NMOS transistor is controlled based on the supply voltage by respectively receiving the second bias signal from voltage biasing module, and wherein each of the first secondary NMOS transistor, the second secondary NMOS transistor, the third secondary NMOS transistor, and the fourth secondary NMOS transistor receives the second bias signal via a respective gate node.

24. The apparatus of claim 23, wherein the drain of the first PMOS transistor is coupled to the gate of the first secondary PMOS transistor, the gate of the second secondary PMOS transistor, the gate of the third secondary PMOS transistor, and the gate of the fourth secondary PMOS transistor.

25. The apparatus of claim 24, wherein the drain of the NMOS transistor is coupled to the gate of the first secondary PMOS transistor, the gate of the second secondary PMOS transistor, the gate of the third secondary PMOS transistor, and the gate of the fourth secondary PMOS transistor, wherein a source of the NMOS transistor is coupled to the ground node, and wherein the gate of the NMOS transistor is coupled to the gate of the first secondary NMOS transistor, the gate of the second secondary NMOS transistor, the gate of the third secondary NMOS transistor, and the gate of the fourth secondary NMOS transistor.

26. The apparatus of claim 23, wherein a second node of the current source is coupled to the ground node.

* * * * *